(12) United States Patent
Tsukagoshi et al.

(10) Patent No.: US 9,601,533 B2
(45) Date of Patent: Mar. 21, 2017

(54) SOLID-STATE IMAGING APPARATUS, METHOD OF MANUFACTURING THE SAME, AND CAMERA

(71) Applicant: CANON KABUSHIKI KAISHA, Tokyo (JP)

(72) Inventors: Yusuke Tsukagoshi, Yokohama (JP); Shunsuke Nakatsuka, Sagamihara (JP); Takayasu Kanesada, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/294,484

(22) Filed: Jun. 3, 2014

(65) Prior Publication Data

US 2014/0375853 A1    Dec. 25, 2014

(30) Foreign Application Priority Data

Jun. 19, 2013   (JP) ................................. 2013-129031

(51) Int. Cl.
*H01L 27/146*   (2006.01)

(52) U.S. Cl.
CPC .... *H01L 27/14625* (2013.01); *H01L 27/1464* (2013.01); *H01L 27/14685* (2013.01); *H01L 27/14609* (2013.01)

(58) Field of Classification Search
CPC ......... H01L 27/14625; H01L 27/14685; H01L 27/1464; H01L 27/14609; H04N 5/335
USPC ............................................ 438/57; 257/432
See application file for complete search history.

(56) References Cited

U.S. PATENT DOCUMENTS

| 7,923,727 | B2 | 4/2011 | Misawa |
| 8,334,497 | B2 | 12/2012 | Takubo et al. |
| 8,809,094 | B2 | 8/2014 | Kumano |
| 2002/0119250 | A1* | 8/2002 | Campana ................ C23C 16/36 427/255.28 |
| 2007/0048625 | A1* | 3/2007 | Nordquist ............. B82Y 10/00 430/5 |
| 2009/0256226 | A1* | 10/2009 | Tatani et al. .................. 257/432 |
| 2010/0230578 | A1* | 9/2010 | Horikoshi ......... H01L 27/14625 250/208.1 |
| 2011/0024857 | A1 | 2/2011 | Toumiya et al. |
| 2012/0199928 | A1* | 8/2012 | Sawada ............ H01L 27/14625 257/432 |

(Continued)

FOREIGN PATENT DOCUMENTS

JP    2007-324248 A    12/2007
JP    2009-170937 A    7/2009
(Continued)

*Primary Examiner* — Mark Prenty
(74) *Attorney, Agent, or Firm* — Fitzpatrick, Cella, Harper & Scinto (57) ABSTRACT

A method of manufacturing a solid-state imaging apparatus, comprising preparing a semiconductor substrate including a photoelectric conversion portion and a structure which includes an insulating member formed on the photoelectric conversion portion and a wiring pattern formed in the insulating member, forming a film made of SiC and/or SiCN on the structure, forming an opening immediately above the photoelectric conversion portion by removing part of the film and part of the insulating member, and depositing a member in the opening and on the film, and forming a light-guide portion by polishing the member so as to expose the film.

17 Claims, 6 Drawing Sheets

(56) References Cited

U.S. PATENT DOCUMENTS

2013/0009321 A1* 1/2013 Kagawa ............... H01L 23/481
257/774

FOREIGN PATENT DOCUMENTS

| JP | 2010056247 A | 3/2010 |
| JP | 2010283145 A | 12/2010 |
| JP | 2011-119362 A | 6/2011 |
| JP | 2013-004685 A | 1/2013 |

* cited by examiner

| MATERIAL OF FILM | REFRACTIVE INDEX@ 633nm | RELATIVE DIELECTRIC CONSTANT | HARDNESS [GPa] | ELASTIC MODULUS [GPa] |
|---|---|---|---|---|
| SiC | 1.75~1.9 | 4.2~5.4 | 9.5~13 | 70~110 |
| SiCN | 1.85~1.95 | 5.0~5.5 | 14~15 | 110~130 |

SOLID-STATE IMAGING APPARATUS, METHOD OF MANUFACTURING THE SAME, AND CAMERA

BACKGROUND OF THE INVENTION

Field of the Invention

The present invention relates to a solid-state imaging apparatus, a method of manufacturing the same, and a camera.

Description of the Related Art

A solid-state imaging apparatus can include a photoelectric conversion portion formed on a semiconductor substrate (to be referred to as a substrate hereinafter), and a light-guide portion formed in an insulating member formed on the substrate so as to guide light to the photoelectric conversion portion. The light-guide portion can be formed by forming an opening in the insulating member, depositing a member of the light-guide portion in the opening and on the insulating member, and polishing the member.

When polishing the above-described member, a polishing stopper can be formed on the insulating member before the polishing step so as to prevent the insulating member from being polished in the polishing step. Japanese Patent Laid-Open No. 2010-56247 discloses an arrangement in which SiOC or porous CDO (Carbon-Doped Oxide) may be used as a polishing stopper when forming a light-guide portion. However, SiOC or porous CDO has a low film density, resulting in a low mechanical strength. Therefore, using SiOC or porous CDO as a polishing stopper may cause damage (a scratch) at the time of polishing. The polishing stopper is required to have a mechanical strength which does not cause damage at the time of polishing.

SUMMARY OF THE INVENTION

The present invention provides a technique advantageous in forming the light-guide portion of a solid-state imaging apparatus.

One of the aspects of the present invention provides a method of manufacturing a solid-state imaging apparatus, comprising preparing a semiconductor substrate including a photoelectric conversion portion and a structure which includes an insulating member formed on the photoelectric conversion portion and a wiring pattern formed in the insulating member, forming a film made of at least one of SiC and SiCN on the structure, forming an opening immediately above the photoelectric conversion portion by removing a part of the film and a part of the insulating member, and depositing a member in the opening and on the film, and forming a light-guide portion by polishing the member so as to expose the film.

Further features of the present invention will become apparent from the following description of exemplary embodiments with reference to the attached drawings.

DESCRIPTION OF THE EMBODIMENTS

Example of Structure of Solid-State Imaging Apparatus

Figure 1A:
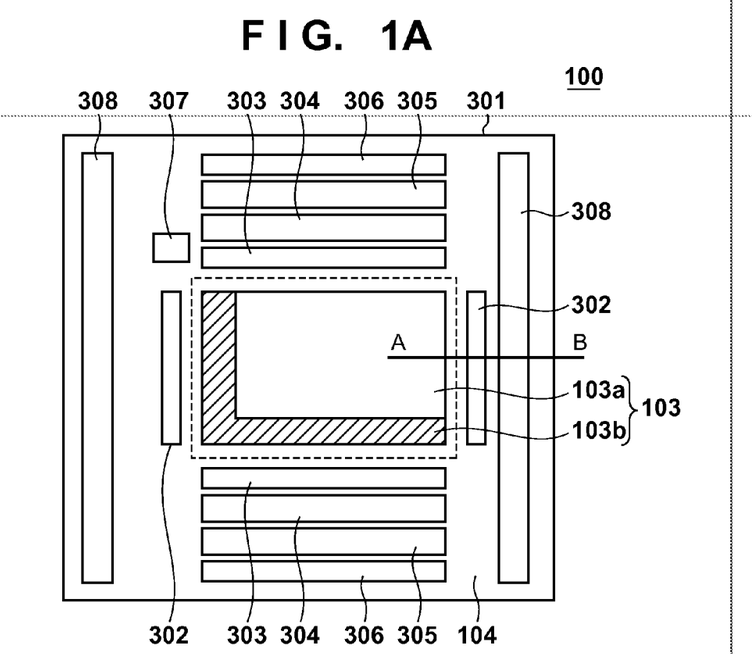
FIGS. 1A and 1B are views for explaining an example of the overall arrangement of a solid-state imaging apparatus 100.

FIG. 1A is a plan view schematically showing an example of the overall arrangement of a solid-state imaging apparatus 100 according to an embodiment. The solid-state imaging apparatus 100 includes an image sensing area 103 and a peripheral area 104. In the image sensing area 103, a pixel array in which a plurality of pixels are arrayed is arranged. As shown in FIG. 1A, the image sensing area 103 may include a light-receiving region 103a where imaging pixels are arranged and a light-shielded region 103b for reading out signals of dark current components. In the peripheral area 104, a driving portion for driving each pixel of the image sensing area 103 and a signal processing portion for processing a signal read out from each pixel of the image sensing area 103 can be formed. In the peripheral area 104, for example, vertical scanning circuits 302, amplifiers 303, analog-to-digital converters 304 (ADCs 304), memories 305, horizontal scanning circuits 306, a timing generator 307, and pad groups 308 can be arranged.

Each pixel need only adopt a well-known circuit arrangement, and can include a photoelectric conversion portion (for example, photodiode), and a plurality of MOS transistors for reading out an electrical signal as a pixel signal by reading out charges generated and accumulated in the photoelectric conversion portion in accordance with the amount of incident light. The plurality of MOS transistors can include, for example, a transfer transistor, amplification transistor, selection transistor, and reset transistor. In response to a control signal supplied to the gate of the transfer transistor, the transfer transistor transfers the charges of the photoelectric conversion portion to a floating diffusion (FD) as the drain region of the transfer transistor. The amplification transistor has a gate terminal connected to the above-described FD, and outputs a current in an amount corresponding to the transferred charge amount. In response to a control signal supplied to the gate of the selection transistor, the selection transistor outputs, as a pixel signal, a signal of a level corresponding to the current amount of the amplification transistor. In response to a control signal supplied to the gate of the reset transistor, the reset transistor resets the potential of the FD.

The vertical scanning circuit 302 outputs the above-described control signal to each pixel. In response to the control signal, each pixel is driven to input a pixel signal to the corresponding amplifier 303. The amplifier 303 is arranged on each column of the pixel array, and amplifies the pixel signal and outputs it to the corresponding ADC 304. The ADC 304 AD-converts the signal from the amplifier 303, and the pixel signal can be processed as a digital signal. The horizontal scanning circuit 306 performs horizontal transferring for the pixel signals read out from each column, and the pixel signals can be sequentially output to the outside. The timing generator 307 can output a signal to the vertical scanning circuit 302 or horizontal scanning circuit 306 according to, for example, a clock signal from the outside, thereby generating a control signal for reading out a pixel signal. The pad group 308 is formed by a plurality of electrodes for reading out pixel signals, and can include an electrode for receiving a control signal for reading out a pixel signal, and a power supply electrode, in addition to an electrode for outputting a readout pixel signal.

Figure 1B:
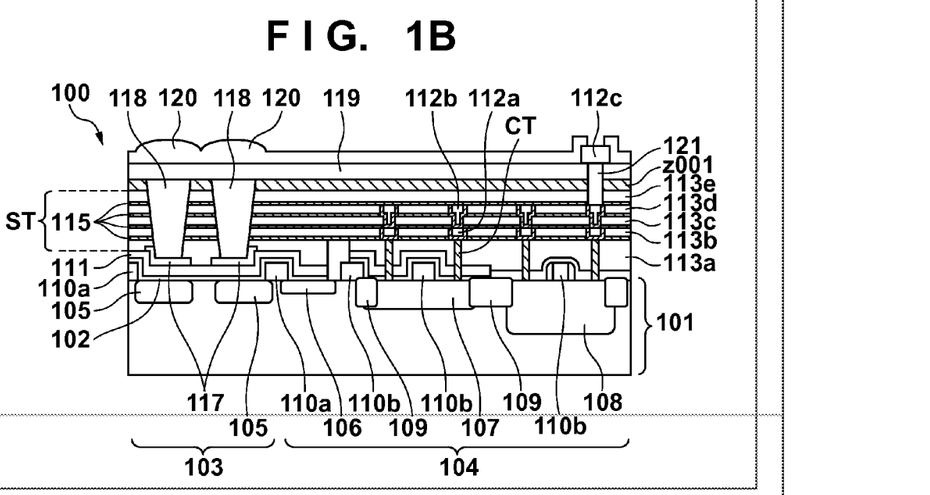

FIG. 1B is a sectional view schematically showing the arrangement taken along a cut line A-B in FIG. 1A. The solid-state imaging apparatus 100 can include, for example, the above-described respective elements (photoelectric conversion portions 105, an FD 106, the transfer transistors, and the like) formed on a semiconductor substrate 101 (to be referred to as a substrate 101 hereinafter). The solid-state imaging apparatus 100 can further include a structure ST formed on the respective elements. The structure ST can include an insulating member, a wiring pattern formed in the insulating member, and light-guide portions 118 for guiding light to the respective photoelectric conversion portions 105. Furthermore, the solid-state imaging apparatus 100 can include inner lenses 120 on the structure ST. Although not shown, the solid-state imaging apparatus 100 can further include microlenses and color filters.

In respective regions divided by element isolation portions 109 of the substrate 101, the photoelectric conversion portions 105, FD 106, and respective transistors can be formed. A well 107 is indicated as a diffusion region for forming MOS transistors of a pixel. A well 108 is indicated as a diffusion region for forming MOS transistors which form the signal processing portion for processing a signal read out from a pixel. A gate electrode 110a is indicated as the gate electrode of the transfer transistor, and a gate electrode 110b is indicated as the gate electrode of the amplification transistor or that of each transistor for signal processing. For example, a protection film 111 is formed on an insulating film 102 on these elements. Etching stoppers 117 are formed immediately above the photoelectric conversion portions 105, as needed.

The structure ST can be formed by, for example, interlayer insulating films 113 (113a to 113e) and wiring patterns 112 (112a and 112b) in a wiring layer. Furthermore, metal diffusion protection films 115 can be formed between the respective interlayer insulating films. A contact plug 114 or the wiring pattern 112 can be formed in each interlayer insulating film 113.

A film z001 is formed on the uppermost interlayer insulating film 113e. Each light-guide portion 118 has its upper surface in the same plane as the upper surface of the film z001. On the film z001 and light-guide portions 118, an interlayer insulating film 119 and the inner lenses 120 can be formed. On the other hand, in the peripheral area 104, an electrode 112c is formed, and electrically connected to the wiring patterns 112 via a plug 121.

The film z001 formed on the uppermost interlayer insulating film 113e is made of at least one of SiC (silicon carbide) and SiCN (nitrogen-doped silicon carbide), that is, the film z001 is made of SiC and/or SiCN. Each light-guide portion 118 has its upper surface in the same plane as the upper surface of the film z001.

Figure 2:
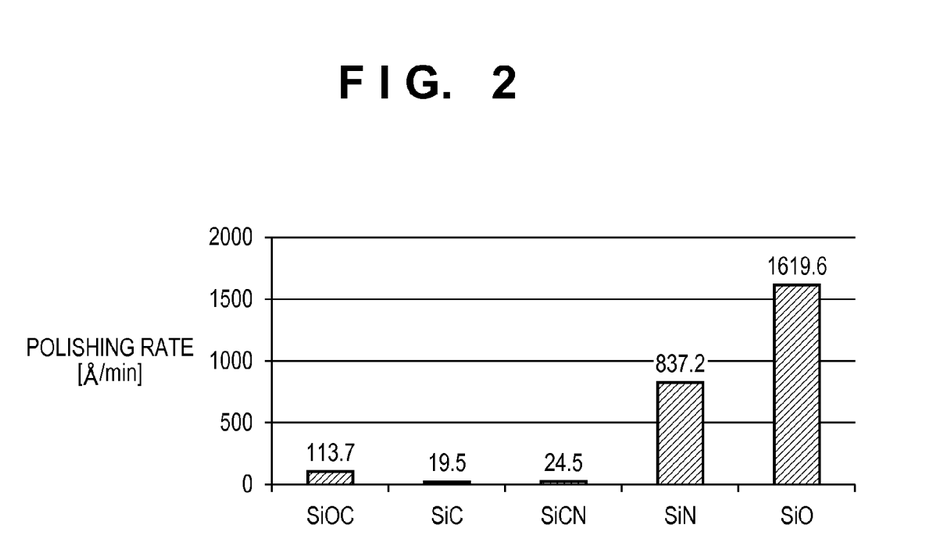
FIG. 2 is a graph for explaining the polishing rate of each member used for the solid-state imaging apparatus 100.

FIG. 2 shows the polishing rate of each member when an alkaline oxide film silica slurry is used. FIG. 2 shows the polishing rates of SiOC (carbon-doped silicon oxide), SiC (silicon carbide), SiCN (nitrogen-doped silicon carbide), SiN (silicon nitride), and SiO (silicon oxide). As a material used for the light-guide portions 118, SiN or SiO is considered. The polishing rates of SiC and SiCN are lower than that of SiN or SiO. It is, therefore, possible to obtain a sufficiently high selectivity (a high ratio between the polishing rates), the film z001 made of SiC or SiCN functions as a polishing stopper in polishing for forming the light-guide portions 118.

The film density of SiOC is low, and thus SiOC can function as a low dielectric constant film (so-called Low-k film). Although it is possible to cause SiOC to function as a polishing stopper, this may result in a low mechanical strength, thereby causing damage (a scratch). Therefore, SiC or SiCN is more preferable.

Figure 3:
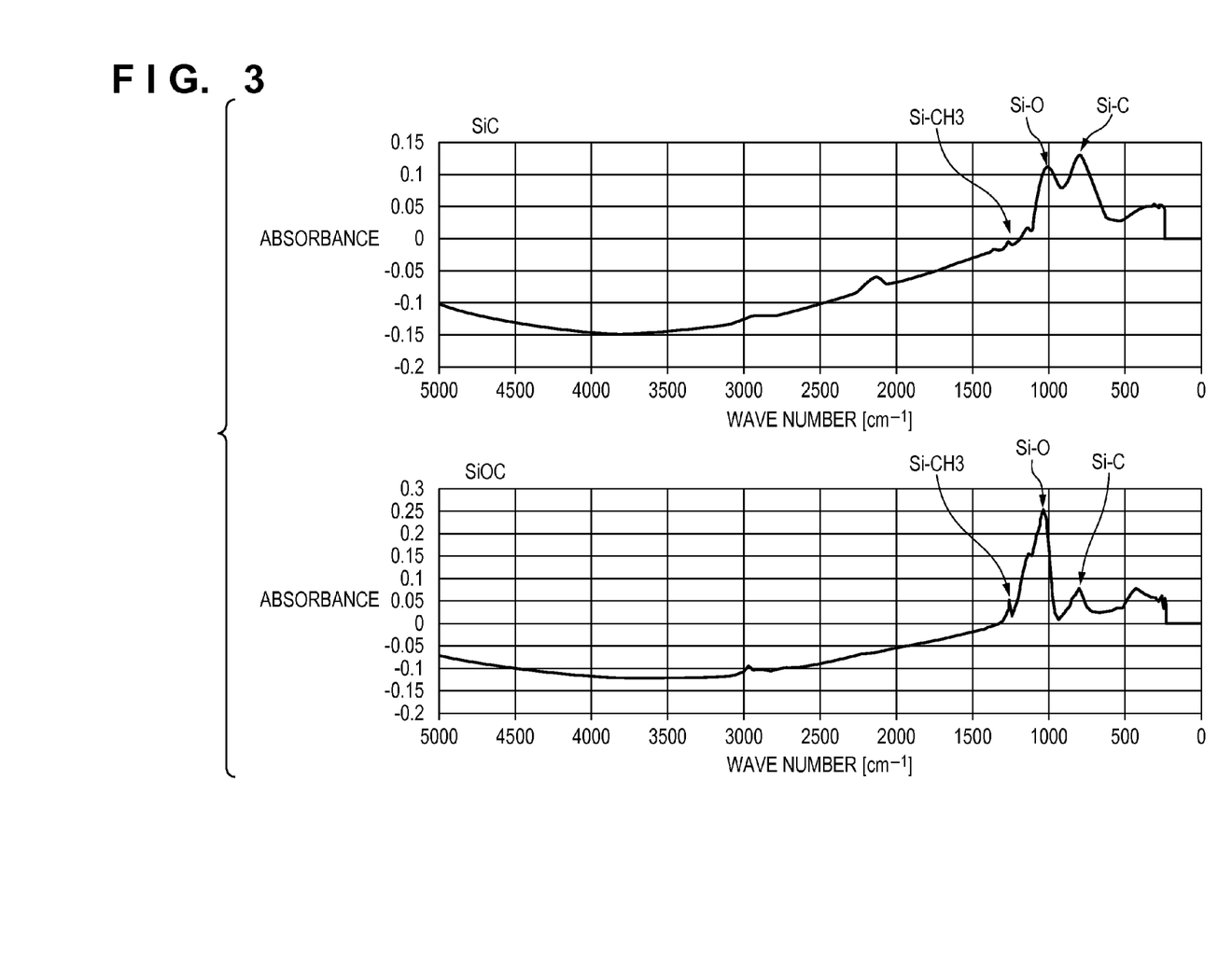
FIG. 3 shows graphs for explaining the results of analyzing SiC and SiOC by FTIR.

FIG. 3 shows the result (infrared absorption spectra) of analyzing SiC and SiOC by FTIR (Fourier Transform Infrared Spectroscopy), in which the abscissa represents the wave number [$cm^{-1}$] of an emitted infrared ray, and the ordinate represents the absorbance. Referring to FIG. 3, SiC has the Si—C bonding peak higher than that of SiOC around a wave number of 790 [$cm^{-1}$], and has the Si—CH$_3$ bonding peak lower than that of SiOC around a wave number of 1,270 [$cm^{-1}$]. In consideration of the area ratio between the Si—CH$_3$ bonding peak and the Si—O bonding peak around a wave number of 1,040 [$cm^{-1}$], SiC has 1.5% or lower, and SiOC has 1.6% or higher.

When SiC or SiCN is used for the film z001, its composition may change depending on the deposition conditions. For a composition having a high carbon content, the film contains many methyl groups and the film density of the film z001 lowers, resulting in a low mechanical strength. On the other hand, for a composition having a low carbon content, the film z001 has a composition similar to that of SiO or SiN, and a sufficiently high selectivity cannot be obtained, thereby disabling the use of the film z001 as a polishing stopper. Therefore, SiC and SiCN to be used for the film z001 is preferably formed within a range exemplified in FIG. 4.

Figure 4:
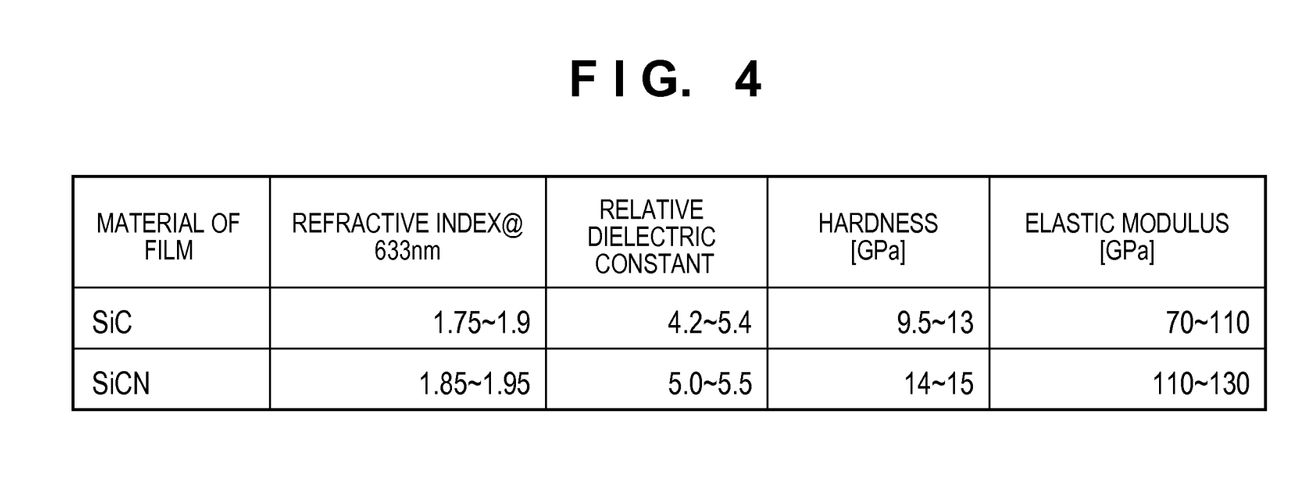
FIG. 4 is a table for explaining an example of preferred parameter ranges for a film z001.

FIG. 4 shows the preferred parameter ranges of SiC and SiCN to be used for the film z001. When SiC is used for the film z001, for example, the refractive index preferably falls within the range from 1.75 (inclusive) to 1.90 (inclusive). Alternatively, the relative dielectric constant preferably falls within the range from 4.2 (inclusive) to 5.4 (inclusive). Alternatively, the hardness preferably falls within the range from 9.5 [GPa] (inclusive) to 13 [GPa] (inclusive). Alternatively, the elastic modulus preferably falls within the range from 70 [GPa] (inclusive) to 110 [GPa] (inclusive). On the other hand, when SiCN is used for the film z001, for example, the refractive index preferably falls within the range from 1.85 (inclusive) to 1.95 (inclusive). The relative dielectric constant preferably falls within the range from 5.0 (inclusive) to 5.5 (inclusive). The hardness preferably falls within the range from 14 [GPa] (inclusive) to 15 [GPa] (inclusive). The elastic modulus preferably falls within the range from 110 [GPa] (inclusive) to 130 [GPa] (inclusive).

The light-guide portions 118 are formed by polishing the member of the light-guide portions 118 deposited on the film z001 and in the openings formed in the film z001 and interlayer insulating films 113. The film z001 is made of SiC and/or SiCN, and it is thus possible to increase the selectivity while maintaining a high mechanical strength. Therefore, the film z001 is hardly damaged by polishing, and can appropriately function as a polishing stopper in polishing.

(Example of Method of Manufacturing Solid-State Imaging Apparatus)

An example of a method of manufacturing the solid-state imaging apparatus 100 will be described with reference to FIGS. 5A to 5F. As exemplified in FIG. 5A, respective elements such as photoelectric conversion portions 105 and transfer transistors are formed on a substrate 101, on which a structure ST including an insulating member and wiring patterns formed in the insulating member is formed. This step can be performed using a well-known semiconductor manufacturing process. More specifically, on the substrate

Figure 5A:
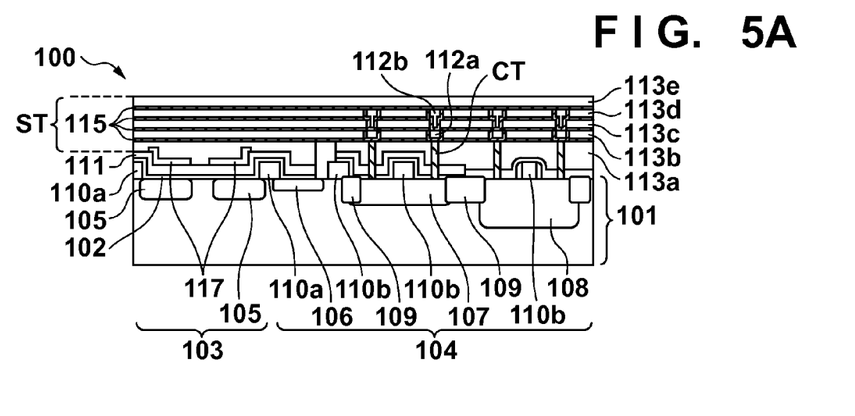
FIGS. 5A to 5F are views for explaining an example of a method of manufacturing the solid-state imaging apparatus 100.

101 made of, for example, a semiconductor such as silicon and having a p-type region, an element isolation portion 109 for electrically isolating respective elements to be formed later can be formed. The element isolation portion 109 can be formed by, for example, an STI (Shallow Trench Isolation) method or LOCOS (LOCal Oxidation of Silicon) method.

After that, in respective regions divided by the element isolation portion 109, photoelectric conversion portions 105, an FD 106, wells 107 and 108, and respective transistors can be formed by ion implantation and annealing. The photoelectric conversion portions 105 and FD 106 can be formed in, for example, an n-type diffusion region. The well 107 is indicated as a diffusion region for forming MOS transistors within a pixel. The well 108 is indicated as a diffusion region for forming MOS transistors which form a signal processing portion for processing a signal read out from the pixel. Each transistor can be formed by forming the gate electrode 110a or 110b on the insulating film on the well 107 or 108, and forming diffusion regions (not shown) serving as a source and drain in the well 107 or 108. In this example, the gate electrode 110a is indicated as the gate electrode of the transfer transistor, and the gate electrode 110b is indicated as the gate electrode of the amplification transistor or that of each transistor for signal processing.

After that, for example, a protection film 111 can be formed on an insulating film 102 on those elements. The protection film 111 may be made of, for example, silicon nitride, or formed by a plurality of layers made of silicon nitride and silicon oxide. The protection film 111 can reduce the influence of each step to be performed later on the photoelectric conversion portions 105. The protection film 111 is preferably formed to have a function of preventing light from being reflected toward the photoelectric conversion portions 105 and a function of preventing metal diffusion in a silicidation step. Furthermore, etching stoppers 117 can be formed on the protection film 111 immediately above the photoelectric conversion portions 105, as needed. The etching stoppers 117 function as stoppers in an etching step to be performed later to form openings 116. The etching stoppers 117 need only have a shape so that they are outside the outer edges of the openings 116 in a planar view with respect to the upper surface of the substrate 101.

On these elements, the structure ST including the insulating member and the wiring patterns formed in the insulating member is formed. The structure ST is formed using the well-known semiconductor manufacturing process, and can be formed by, for example, alternately forming an interlayer insulating film and a wiring layer. For example, interlayer insulating films 113 (113a to 113e) made of silicon oxide or the like can be formed. For example, metal diffusion protection films 115 can be formed between the respective interlayer insulating films 113. In each interlayer insulating film 113, a contact plug or wiring pattern can be formed. For example, a contact plug 114 for electrically connecting a wiring pattern with each diffusion region of the substrate 101 is formed in the first interlayer insulating film 113a. By using, for example, a damascene method, a wiring pattern 112a can be formed in the second interlayer insulating film 113b and a wiring pattern 112b can be formed in the third and fourth interlayer insulating films 113c and 113d. For example, silicon nitride is used for the metal diffusion protection films 115, and each metal diffusion protection film 115 can function as a stopper when forming, in each interlayer insulating film 113 by etching, an opening for forming each wiring pattern 112. The structure ST is not limited to the above-described one, and can be formed by another well-known manufacturing method.

Figure 5B:
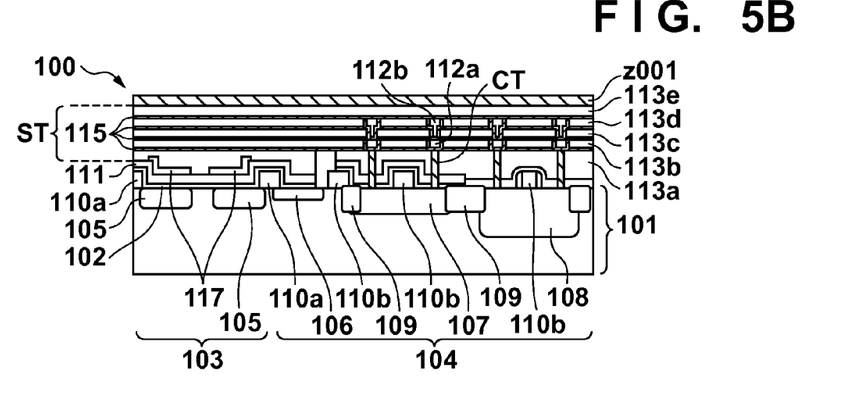

As exemplified in FIG. 5B, a film z001 made of SiC is formed on the fifth interlayer insulating film 113e. Since the SiC film as the film z001 has a polishing rate lower than those of other members as described with reference to FIG. 2, the SiC film can function as a polishing stopper in a polishing step to be performed later. The film z001 can be formed by, for example, a plasma-enhanced chemical vapor deposition (PECVD) method. As source gases, for example, 4 MS (tetramethylsilane) (1,000 [sccm]) and $CO_2$ (2,000 [sccm]) are usable. It is only necessary to set a stage temperature to, for example, 400 [° C.] and the pressure within a chamber to, for example, 2 [Torr]. Furthermore, for example, an upper electrode can be connected to a high-frequency power supply which applies a high-frequency power of 500 [W]. A lower electrode can be connected to a low-frequency power supply which supplies a low-frequency power of 400 [W].

Figure 5C:
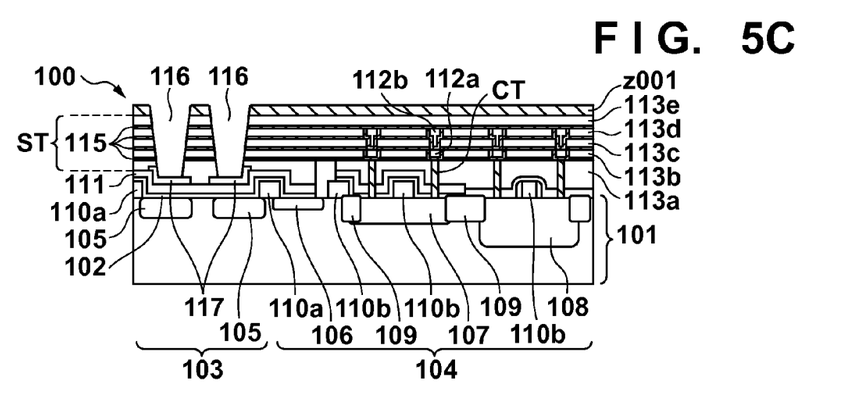

As exemplified in FIG. 5C, openings 116 are formed by removing the film z001 and the insulating member including the interlayer insulating films 113 and metal diffusion protection films 115 immediately above the photoelectric conversion portions 105. The openings 116 can be formed by forming a photoresist pattern on the film z001 so as to expose portions of the film z001 where the openings 116 are to be formed, and performing etching using the photoresist pattern as a mask. The openings 116 are formed immediately above the photoelectric conversion portions 105 so that light-guide portions 118 for guiding incident light to the photoelectric conversion portions 105 will be formed later, and the shape of the openings 116 may be a circle or rectangle in the planar view with respect to the upper surface of the substrate 101.

The insulating member (including the interlayer insulating films 113 and metal diffusion protection films 115) need only be at least partially removed. In this example, however, a case in which the openings 116 are formed so as to expose the etching stoppers 117 is exemplified. As the etching stoppers 117, members (for example, silicon nitride or silicon oxynitride) having an etching rate lower than that of the interlayer insulating film 113a is usable. Note that the above-described etching step may be performed in a plurality of etching steps in which etching conditions are different. Although a case in which the openings 116 are formed in the image sensing area 103 is exemplified here, openings 116 can also be formed in the peripheral area 104, as needed.

Figure 5D:
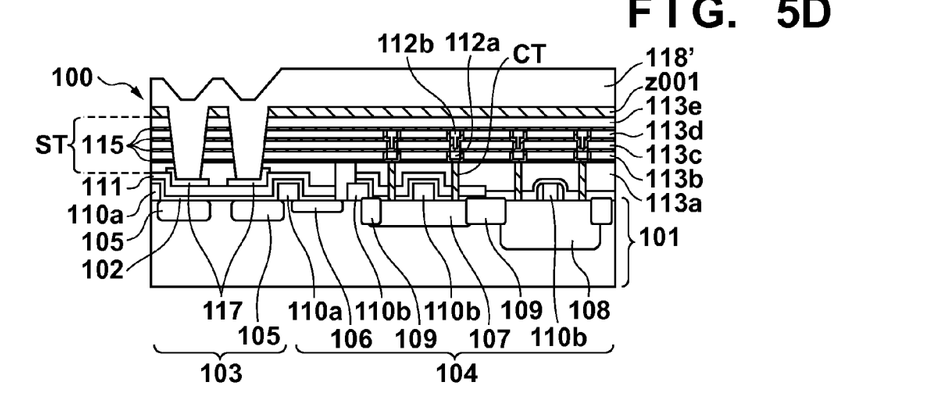

As exemplified in FIG. 5D, a member 118' as a material of the light-guide portions 118 is deposited in the openings 116 and on the film z001. The member 118' can be deposited by, for example, a CVD method. This step may be performed in a plurality of deposition steps in which conditions are different. For example, the member 118' may be deposited first under conditions which consider adhesion with the etching stoppers 117, the interlayer insulating films 113, or the like, and then deposited under conditions which prioritize the formation speed. Alternatively, a different material may be used in the middle of deposition.

Note that a material having a refractive index higher than that of each interlayer insulating film 113 is usable for the member 118'. When, for example, silicon oxide (a refractive index of 1.4 to 1.6) is used for each interlayer insulating film 113, silicon nitride (a refractive index of 1.7 to 2.3) can be used for the member 118'. This enables incident light to be effectively reflected by the side surface of the member 118' toward the photoelectric conversion portions 105, and can prevent color mixing with an adjacent pixel. Note that a material having a refractive index higher than that of each interlayer insulating film 113 is preferably used for the member 118'. However, the member 118' need only be arranged to form light-guide portions, and the present invention is not limited to the above arrangement. For example, a reflection member for reflecting light may be formed on the side surface of each opening 116, or an air gap (or vacuum) may be formed.

Figure 5E:
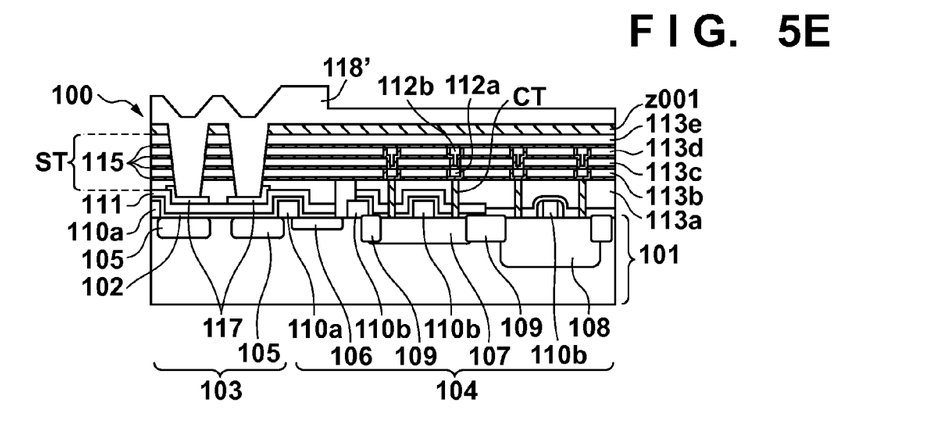

As exemplified in FIG. 5E, part of the member 118' in the peripheral area 104 is removed. This step can be performed by, for example, forming on the member 118' a photoresist pattern so as to expose a portion of the member 118' corresponding to the peripheral area 104, and performing etching using the photoresist pattern as a mask.

The member 118' is preferably removed so that the entire upper surface of the member 118' is uniformly polished in the polishing step to be performed later. That is, the step amount between the upper surfaces of light-guide portions 118 to be formed in the polishing step to be performed later needs to be smaller than a desired value. Assume, for example, that the refractive index of the member 118' is 2. In this case, for blue light of a wavelength of 450 nm, the step amount is preferably suppressed to ½ (that is, about 60 nm) or smaller of ¼ of the wavelength of the blue light. In this example, the portion of the member 118' corresponding to the peripheral area 104 is thinned so that the step amount becomes equal to or smaller than 60 nm in the polishing step to be performed later. As shown in FIG. 5E, for example, the portion of the member 118' corresponding to the peripheral area 104 may be entirely or partially thinned. Note that a portion of the member 118' corresponding to the image sensing area 103 may be partially removed in the etching step for the purpose of uniformly polishing the entire upper surface of the member 118' in the polishing step to be performed later. The above-described etching step is preferably performed so as not to expose the film z001 so that the film z001 is excessively polished in the polishing step to be performed later.

Figure 5F:
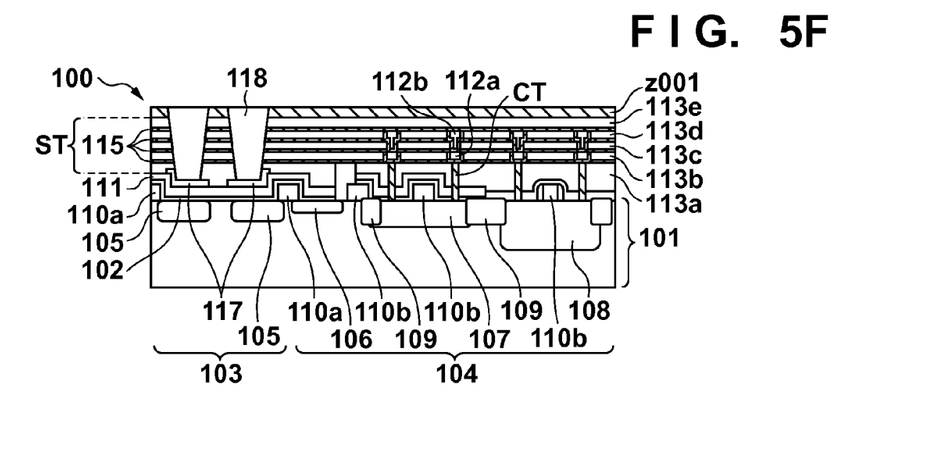

As exemplified in FIG. 5F, planarization is performed by polishing the upper surface of the member 118'. The upper surface of the member 118' is polished until the film z001 is exposed. With the above procedure, the light-guide portions 118 having the upper surfaces in the same plane as the upper surface of the film z001 are formed. Polishing can be performed by CMP using an alkaline oxide film silica slurry. Since SiC is used for the film z001, the film z001 has a high mechanical strength, and is hardly damaged (scratched) by polishing, as described with reference to FIG. 3. As described with reference to FIG. 5E, since part of the member 118' has been removed in the peripheral area 104, the entire upper surface of the member 118' can be uniformly polished, and the upper surface of the member 118' can be effectively planarized.

Note that polishing preferably, simultaneously starts for portions of the film z001, which respectively correspond to the peripheral area 104 and image sensing area 103. Since, however, the polishing rate of the film z001 is lower than that of the member 118', even if the portion corresponding to the peripheral area 104 starts to be polished first, the entire upper surface of the member 118' can be planarized.

In the above-described step of forming the film z001, the film thickness of the film z001 can be decided according to the step amount of the member 118' to be polished. For example, as the step amount of the member 118' is larger (the openings 116 are larger), the film z001 having a larger film thickness need only be formed.

Finally, a sixth interlayer insulating film 119, a plug 121, a wiring layer including an electrode 112c, and a layer including inner lenses 120 can be sequentially formed, thereby obtaining the structure shown in FIG. 1B. These elements can be formed by the same method as that described above using the well-known semiconductor manufacturing process. The inner lenses 120 are formed in correspondence with the photoelectric conversion portions 105, and can be formed using, for example, a high refractive index member such as silicon nitride. The inner lenses 120 can be formed by, for example, reflow, etching, exposure processing using a gradation mask, and the like. Microlenses (not shown) can be further formed on a planarization film on the inner lenses 120. Note that color filters each for transmitting light of a predetermined wavelength can be formed under the microlenses, as needed.

According to the above-described manufacturing method, since the film z001 functions as a polishing stopper and SiC is used for the film z001, the film z001 has a high mechanical strength, and is hardly damaged (scratched) by polishing.

Although a case in which SiC is used for the film z001 serving as a polishing stopper has been described above, it is also possible to obtain the same effects by using SiCN. The polishing rate of SiCN is lower than those of other members, as described above with reference to FIG. 2. Therefore, when using SiCN for the film z001, the film z001 functions as a polishing stopper in the polishing step to be performed later. Since SiCN is used for the film z001, the film z001 has a high mechanical strength as described with reference to FIG. 3, and it is possible to obtain the same effects as those when SiC is used for the film z001. An SiCN film as the film z001 can be formed by, for example, the PECVD method. As source gases, for example, 4 MS (400 [sccm]), $NH_3$ (1,200 [sccm]), and $N_2$ (1,200 [sccm]) can be used. It is only necessary to set the stage temperature to, for example, 400 [° C.], and the chamber pressure to, for example, 4 [Torr]. Furthermore, for the plasma power, for example, it is only necessary to set a high frequency power to 500 [W] and a low frequency power to 500 [W].

The present invention is not limited to the above-described contents, and can be appropriately changed in accordance with the purpose, state, application, function, and other specifications, that is, can be carried out by another embodiment. The sensor portion, for example, is formed as a CMOS image sensor, and may be implemented as any other sensor.

(Imaging System)

The solid-state imaging apparatus included in an imaging system represented by a camera or the like has been described above. The imaging system conceptually includes not only a device whose principal purpose is shooting but also a device (for example, a personal computer or portable terminal) additionally provided with a shooting function. The imaging system can include the solid-state imaging apparatus according to the present invention exemplified as the above-mentioned embodiment, and a processing unit for processing a signal output from the solid-state imaging apparatus. This processing unit can include, for example, an A/D converter, and a processor for processing digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-129031, filed Jun. 19, 2013, which is hereby incorporated by reference herein in its entirety.

What is claimed is:

1. A solid-state imaging apparatus comprising:
a photoelectric conversion portion disposed on a semiconductor substrate;
a structure including an insulating member disposed on the semiconductor substrate, and a wiring pattern being arranged in the insulating member;
a film disposed on the structure and separated from the wiring pattern by part of the insulating member, the film being made of at least one of SiC and SiCN;
a light-guide portion embedded in the film and the insulating member so as to guide light to the photoelectric conversion portion; and
an insulating film disposed on an upper surface of the light-guide portion and an upper surface of the film, the insulating film having a lower surface contacting the upper surface of the light-guide portion and the upper surface of the film.

2. The apparatus according to claim 1, wherein the film is made of SiC, and satisfies at least one of conditions
that a refractive index falls within a range from 1.75 (inclusive) to 1.90 (inclusive),
that a relative dielectric constant falls within a range from 4.2 (inclusive) to 5.4 (inclusive),
that a hardness falls within a range from 9.5 [GPa] (inclusive) to 13 [GPa] (inclusive), and
that an elastic modulus falls within a range from 70 [GPa] (inclusive) to 110 [GPa] (inclusive).

3. The apparatus according to claim 1, wherein the film is made of SiCN, and satisfies at least one of conditions
that a refractive index falls within a range from 1.85 (inclusive) to 1.95 (inclusive),
that a relative dielectric constant falls within a range from 5.0 (inclusive) to 5.5 (inclusive),
that a hardness falls within a range from 14 [GPa] (inclusive) to 15 [GPa] (inclusive), and
that an elastic modulus falls within a range from 110 [GPa] (inclusive) to 130 [GPa] (inclusive).

4. The apparatus according to claim 1, wherein a member forming the light-guide portion has a refractive index higher than that of the insulating member.

5. A camera comprising:
a solid-state imaging apparatus comprising:
a photoelectric conversion portion disposed on a semiconductor substrate,
a structure including an insulating member disposed on the semiconductor substrate, and a wiring pattern being arranged in the insulating member,
a film disposed on the structure and separated from the wiring pattern by part of the insulating member, the film being made of at least one of SiC and SiCN,
a light-guide portion embedded in the film and the insulating member so as to guide light to the photoelectric conversion portion, and
an insulating film disposed on an upper surface of the light-guide portion and an upper surface of the film, the insulating film having a lower surface contacting the upper surface of the light-guide portion and the upper surface of the film; and
a processor configured to process a signal output from the solid-state imaging apparatus.

6. The apparatus according to claim 1, further comprising a reflection member formed on a side surface of the member.

7. The apparatus according to claim 1, wherein an air gap is formed between a side surface of the member and the insulating member.

8. A solid-state imaging apparatus comprising:
a photoelectric conversion portion disposed in a semiconductor substrate;
a structure including an insulating member made of silicon oxide and disposed on the semiconductor substrate, and a wiring pattern being arranged in the insulating member, the insulating member having an opening located above the photoelectric conversion portion;
a first film disposed on an upper surface of the structure and separated from the wiring pattern by part of the insulating member, the first film being made of at least one of SiC and SiCN;
a member made of silicon nitride and embedded in the opening of the insulating member; and
a second film disposed on an upper surface of the first film and an upper surface of the member, the second film having a lower surface contacting the upper surface of the first film and the upper surface of the member.

9. The apparatus according to claim 8, wherein the upper surface of the member and the upper surface of the first film are in the same plane as each other.

10. The apparatus according to claim 8, wherein an electrode is disposed on the second film.

11. The apparatus according to claim 8, wherein a lens made of silicon nitride is disposed on the second film.

12. A camera comprising:
a solid-state imaging apparatus comprising:
a photoelectric conversion portion disposed in a semiconductor substrate,
a structure including an insulating member made of silicon oxide and disposed on the semiconductor substrate, and a wiring pattern being arranged in the insulating member, the insulating member having an opening located above the photoelectric conversion portion,
a first film disposed on an upper surface of the structure and separated from the wiring pattern by part of the insulating member, the first film being made of at least one of SiC and SiCN,
a member made of silicon nitride and embedded in the opening of the insulating member, and
a second film disposed on an upper surface of the first film and an upper surface of the member, the second film having a lower surface contacting the upper surface of the first film and the upper surface of the member; and
a processor configured to process a signal output from the solid-state imaging apparatus.

13. The apparatus according to claim 1, wherein the structure includes a plurality of metal layers, and the wiring pattern is provided in uppermost one of the plurality of metal layers.

14. The apparatus according to claim 8, wherein the structure includes a plurality of metal layers, and the wiring pattern is provided in uppermost one of the plurality of metal layers.

15. The apparatus according to claim 1, wherein the lower surface of the insulating film is a flat surface.

16. The apparatus according to claim 1, wherein the film is made of a material different from a material of the light-guide portion.

17. The apparatus according to claim 1, wherein the upper surface of the film is made of a material different from a material of the upper surface of the light-guide portion.

* * * * *